United States Patent [19]

Chambon

[11] Patent Number: 4,464,623
[45] Date of Patent: Aug. 7, 1984

[54] PROBE POINT DEVICE FOR ELECTRICAL TESTS

[75] Inventor: Michel Chambon, Chassieu, France

[73] Assignee: Lucien Ferraz & Cie, Lyons, France

[21] Appl. No.: 394,342

[22] Filed: Jul. 1, 1982

[51] Int. Cl.³ ............................................ G01R 31/02
[52] U.S. Cl. .................................. 324/72.5; 324/149; 324/65 P; 324/158 P
[58] Field of Search .............. 324/51, 72.5, 110, 149, 324/158 P, 65 P; 337/411

[56] References Cited

U.S. PATENT DOCUMENTS

| | | | |
|---|---|---|---|
| 2,547,248 | 4/1951 | Batholomew | 324/149 |
| 2,654,068 | 9/1953 | Mertens | 324/149 |
| 2,885,648 | 5/1959 | Kin | 324/65 P |
| 3,541,391 | 11/1970 | Ritcherle | 324/110 |
| 3,863,145 | 1/1975 | Kelly et al. | 324/51 |
| 4,030,030 | 6/1977 | Bennekom et al. | |
| 4,263,547 | 4/1981 | Johnson | 324/158 P |

FOREIGN PATENT DOCUMENTS 837728 5/1952 Fed. Rep. of Germany .
2408146 6/1979 France .

Primary Examiner—Michael J. Tokar
Assistant Examiner—B. J. Kelley
Attorney, Agent, or Firm—Dowell & Dowell

[57] ABSTRACT

In a probe point device for electrical tests the metallic point proper is carried by a hollow insulating handle or push member on which an insulating head is slidably mounted, spring and abutment means normally maintaining the head at a position of rest at which it wholly covers the point. A fuse cartridge is disposed within the push member to connect the point with the flexible cable provided at the rear of the said member. This cartridge has at its front end an axial indicator button which, when the cartridge blows, acts on a pivoted pawl to engage a first nose thereof into an inner circular groove provided in the head, thus locking the push member with respect to the head at the position of rest. A second tooth of the pivoted point member also locks the push member with respect to the head if the cartridge is missing.

7 Claims, 6 Drawing Figures

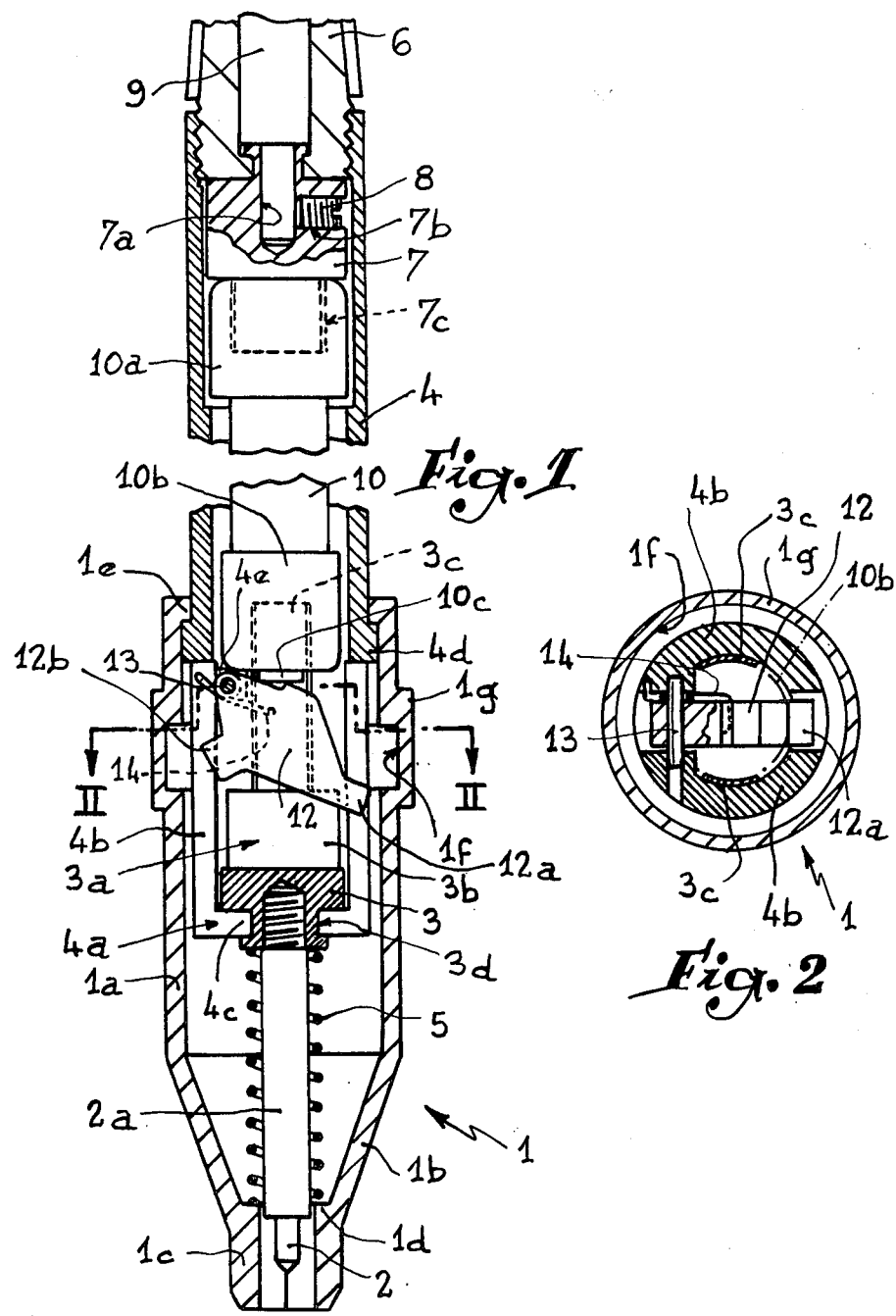

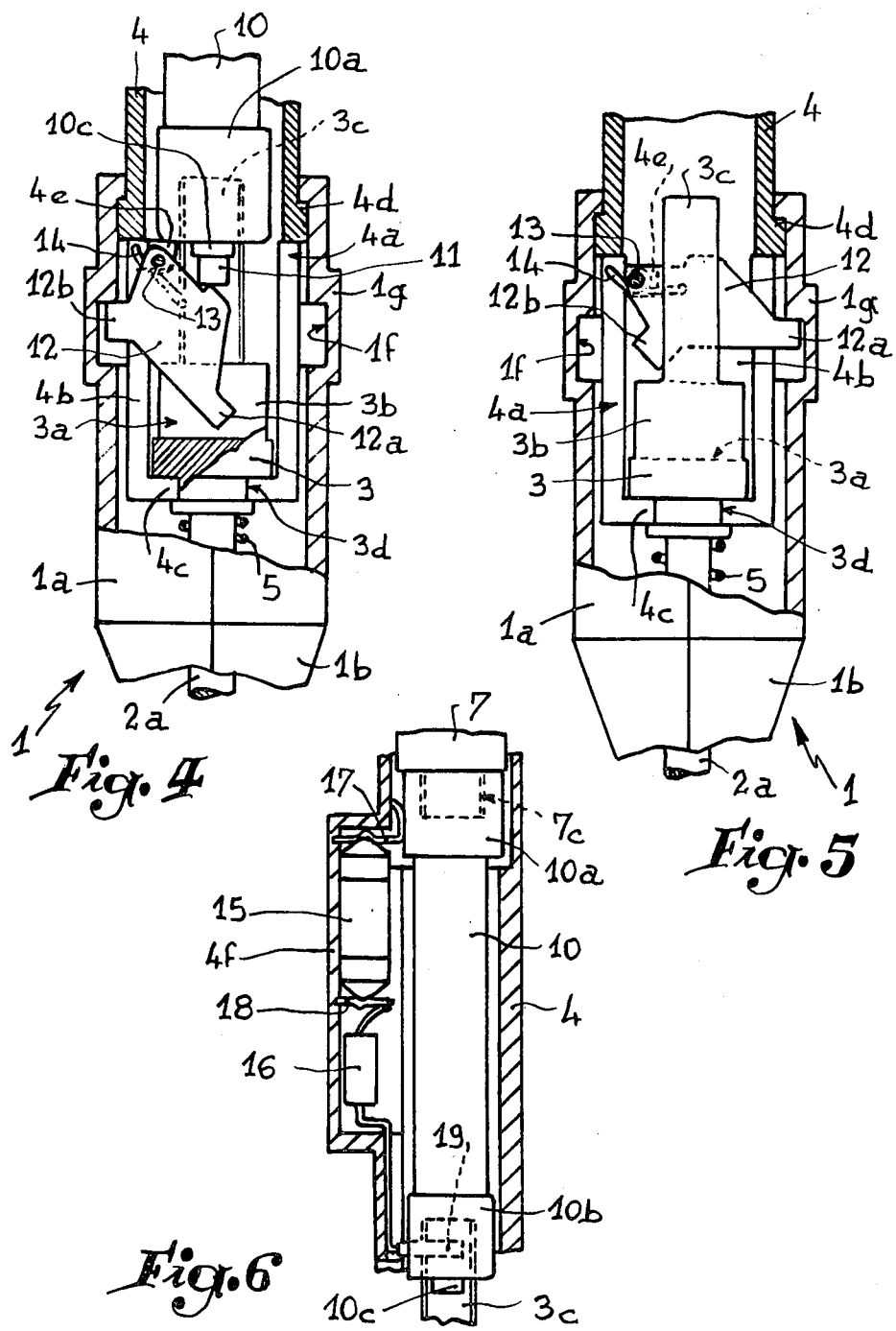

PROBE POINT DEVICE FOR ELECTRICAL TESTS

This invention relates to probe point devices which are used in Electrotechnics for realizing a momentary connection between a flexible cable fixed to the device and a conductor, a bar or any metallic member which should be normally alive, more particularly in order to test and to measure the characteristics of the voltage applied (value in volts, frequency, phase angle, etc...).

Such devices comprise a metallic point proper and an insulating handle through which the said point is connected with the flexible cable. In the case of low voltages the point may be directly fixed to the conducting core provided within the handle and to the opposed end of which the cable is connected, for instance by means of an axially perforated terminal with a transverse clamping screw. Owing to the low value of the voltage there is no risk for the operator even if he accidentally touches the metallic point or the terminal. But as soon as the voltages and the currents exceed a safe limit, these devices become dangerous and should be provided with safety means.

The metallic point may for instance be carried by an insulating push member slidably mounted in a hollow insulating body or head which is normally maintained by spring and abutment means at a position of rest at which it wholly covers the point. When the head is applied against a metallic structure, the push member may slide against the action of the spring means to bring the point into contact with the structure. The push member may be equipped with an inner fuse cartridge which protects the device and the associated apparatus against short-circuits.

But of course when the cartridge has blown the apparatus is fully inoperative and moreover it is dangerous, since it may erroneously indicate to an uniformed or careless operator that a conductor or the like is not alive while it is on the contrary under a high voltage.

According to the invention this inconvenience is eliminated by making the cartridge replaceable and by providing means which, as long as a blown cartridge has not been correctly replaced by a fresh one, lock the head on the push member at the position of rest at which, as above indicated, the metallic point is wholly disposed within the insulating head.

In the accompanying drawings:

FIG. 1 is a general longitudinal section of a probe point device according to a first embodiment of the invention, the parts being illustrated at the position of rest under normal conditions.

FIG. 2 is a transverse section taken along line II—II of FIG. 1.

FIG. 4 is a partial longitudinal section showing the device locked after the fuse cartridge has blown.

FIG. 5 is also a fragmental section illustrating the device with the push member locked owing to the non-replacement of the fuse cartridge.

FIG. 6 is a small scale sectional view illustrating a modified embodiment provided with a light bulb indicating that the cartridge has blown.

Figure 3:
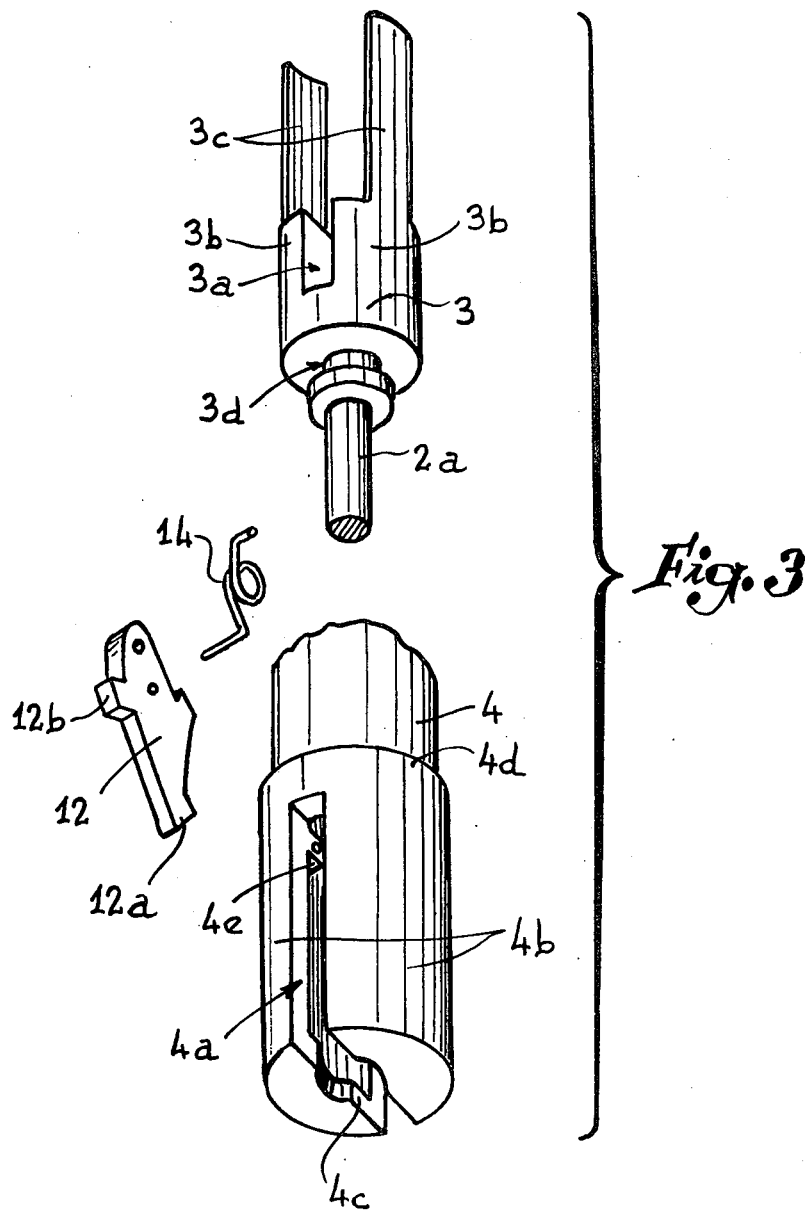
FIG. 3 is an exploded perspective view illustrating the core with the point carrying rod, the slotted front end of the push member, the pawl and its spring.

Referring to FIG. 1 the probe point device illustrated comprises a hollow insulating body or head 1 including a cylindrical portion 1a, a conical portion 1b and a terminal or front portion 1c of small diameter within which the metallic point 2 is disposed at rest. This point is in one with an axial rod 2a adapted to slide through portion 1c. The opposed or rear end of rod 2a is screwed in a metallic core 3 of substantially cylindrical cross-section. The rear portion of core 3, i.e. the portion thereof opposed to rod 2a, is transversely slotted, as indicated at 3a in FIG. 3, the slot defining two branches 3b which extend rearwardly in the form of relatively this resilient blades 3c of arcuate cross-section.

Core 3 is retained in the front end of a tubular push member 4 which extends rearwardly well beyond head 1 in which it is slidably engaged. The front end portion of this member 4 is transversely slotted as indicated at 4a (see FIG. 3) and the two branches thus formed have each an inwardly directed terminal flange with an arcuate edge 4c which is engaged in a circular groove 3d provided in the unslotted front portion, of reduced diameter, of core 3. Push member 4 is made of a resilient material in such manner that branches 4b may be moved apart when mounting core 3 between them. But of course the said branches could also be formed as separate parts appropriately secured to push member 4.

Push member 4 is biassed rearwardly by a spring 5 disposed around rod 2a and which takes rest against an inner shoulder 1d provided at the inner end of the bore of terminal portion 1c of head 1. At the position of rest of rod 2a point 2 should be wholly disposed within the said bore. In order to define this position in a safe manner the portion of push member 4 which extends beyond head 1 is of somewhat smaller diameter so as to determine at the rear of slot 4a a short plain circular bead 4d (see FIG. 3) which forms a shoulder adapted to act as an abutment against an inner flange 1e (FIG. 1) provided at the rear end of head 1, this flange further forming a guide for the rear portion of member 4. In order to permit of mounting head 1 on member 4, the said head may be made of two halves which are appropriately glued or otherwise fixed to each other. The inner flange 1e could also be made as a separate cup-shaped annular member screwed onto the rear end of head 1.

The rear end of push member 4 is internally screw-threaded to receive an insulating plug 6 to the front end of which is secured a cylindrical block or terminal 5, of somewhat smaller diameter having a rearwardly opening axial blind bore 7a adapted to receive the bare end of the electrical cable 9 associated to the device, this end being clamped in position by means of a screw 8 screwed into a threaded radial hole 7b provided in terminal 7. As illustrated plug 6 has an axial hole for passage of cable 9.

The front end of terminal 7 is formed with an axial extension 7c which is engaged into an axial depression provided in the rear head 10a of a fuse cartridge 10 disposed within push member 4. The other head 10b of cartridge 10, of substantially smaller diameter, is equipped with an axial indicating button or "percutor" 11 (see FIG. 4). Head 10b is engaged between blades 3c.

The details of button 11 have not been illustrated since such devices are well known in the art. They are normally retained within the cartridge by a fusible wire against the action of a spring. When the cartridge blows the fusible wire melts and the button protrudes from the cartridge.

In the slot 4a (FIG. 3) of the front portion 4b of push member 4 and just in front of the head 10b of fuse cartridge 10 a flat pawl 12 is mounted on a transverse pivot 13, as clearly illustrated in FIG. 2. Pawl 12 is of reduced thickness so as to be also freely movable within the slot 3a (FIG. 3) of core 3. Its pivot 13 is mounted in bosses 4e provided within push member 4 at a distance from the general axis of the device. This pivot carries a light torsional spring 14 which urges the pawl counterclockwise in FIG. 1. As shown in FIG. 3, the ends of this spring 14 are bent at right angle so as to be engaged in respective perforations of the pawl and of one of the branches 4b defined by the slot 4a of push member 4 (see FIG. 3). Pawl 12 comprises two substantially opposed noses 12a and 12b which, when the device is at the position of rest illustrated in FIG. 1, are adapted to cooperate selectively with an inner circular groove 1f provided in an enlarged portion 1g of head 1 whatever may be the relative angular position of the said head with respect to push member 4. In normal operation pawl 12 bears against the free end of indicator button 11 which is then at its retracted position (and therefore is not to be seen in FIG. 1). Noses 12a and 12b are then both inoperative with respect to groove 1f and therefore push member 4 may freely slide within head 1 against the action of spring 5.

It is further to be noted that the inner bosses 4e which carry the pivot 13 of pawl 12, also act as limiting abutments for the front head 10b of the cartridge which is thus clamped between the said bosses and the rear plug 6 of the device.

As above explained, when the parts are at the respective positions illustrated in FIG. 1, the noses 12a and 12b of pawl 12 are both inoperative. Push member 4 may therefore be displaced forwardly (downwardly in FIG. 1) against the action of spring 5. The point 2 then projects and may be brought into contact against the conductor or other electric member which is to be tested. In actual practice the whole of the apparatus may also be applied against this latter by acting on plug 6 and then spring 5 is compressed until point 2 comes into contact with the said conductor. In both cases cable 9 permits of effecting the electrical tests and/or measures desired without any danger for the operator.

If the apparatus with which cable 9 is connected is defective and has a short-circuit or the like, fuse cartridge 10 blows and protects the circuits against damages. Its indicator button 11 then tends to protrude downwardly in FIG. 1. Pawl 12 is thus urged clockwise and when the device is returned to the position of rest, nose 12b becomes engaged into groove 1f (position illustrated in FIG. 4) thus locking push member 4 relatively to head 1. The device is then inoperative until the blown cartridge is replaced by a fresh one.

When the cartridge 10 is removed, pawl 12 is liberated and under the action of its spring 14 it rotates counterclockwise, its other nose 12a thus becoming engaged into groove 1f. Here again the device is locked as illustrated in FIG. 5 until a fresh cartridge is mounted. It is to be noted that owing to the large diameter of the first head 10a of the cartridge and to the presence of extension 7c, any error in the disposition or in the type of the cartridge introduced into push member 4 is impossible.

In the modified embodiment of FIG. 6 push member 4 is formed with a lateral enlargement 4f situated laterally with respect to the fuse cartridge 10. This enlargement defines a space within which are disposed a discharge bulb 15 and a resistor 16 mounted in series between the heads 10a and 10b of the cartridge. For this purpose the enlarged portion has a first resilient blade 17 bent at right angles, one of its branches receiving a first end of bulb 15 while the other acts as a lateral contact resiliently applied against head 10a. A second blade 18 cooperates with the second end of bulb 15 and is soldered to one end of resistor 16. The second end of this latter is in turn soldered to a third resilient blade 19 which is arranged to form a lateral contact applied against the second head 10b of the cartridge. When the cartridge has blown electric current flows through resistor 16 and bulb 15 which acts as an optical signalling device.

Of course the wall of the enlarged portion 4f should be more or less transparent or it should include a window in front of bulb 15.

What is claimed is:

1. In a probe point device for electrical tests, comprising an insulating push member having a longitudinal axis with a front and a rear end, with said front end carrying a metallic point and with said rear end having a terminal adapted to be connected with a cable, a hollow insulating head slidably mounted on said push member, means to resiliently maintain said head on said push member at a position of rest at which it wholly covers said metallic point, and a fuse cartridge disposed within said push member to connect said metallic point with said terminal, the improvement which consists in said cartridge being removable and replaceable and in locking means being provided to lock said push member with said head at said position of rest when said terminal and said point are not electrically connected with each other by said cartridge.

2. In a probe point device as claimed in claim 1, said locking means comprising a pawl pivoted to said push member about an axis substantially transverse to the longitudinal axis of said push member and spring means urging said pawl against said cartridge, said pawl having a tooth which is at an inoperative position with respect to said head when said pawl bears against said fuse cartridge, and said head being formed with an inner groove into which said tooth is pushed by said spring means in the absence of said fuse cartridge when said head is at said position of rest.

3. In a probe point device as claimed in claim 1, said cartridge having an axial indicator button adapted to protrude from said cartridge when said cartridge blows and said locking means comprising a pawl pivoted to said push member about an axis substantially transverse to the longitudinal axis of said push member and spring means urging said pawl against said indicator button, with said pawl having a tooth which is at an inoperative position with respect to said head when said pawl bears against said indicator button retained within said cartridge, and said head being formed with an inner groove into which said tooth is pushed by said indicator button when said head is at said position of rest after said fuse cartridge has blown.

4. In a probe point device as claimed in claim 1 said cartridge having an axial indicator button adapted to protrude from said cartridge when said cartridge blows and said locking means comprising a pawl pivoted to said push member about an axis substantially transverse to the longitudinal axis of said push member and spring means urging said pawl against said indicator button, with said pawl having a first and a second teeth substantially opposed to each other with respect to said longitudinal axis of said push member, said teeth being both at an inoperative position with respect to said head when said pawl bears against said indicator button retained within said cartridge, and said head being formed with an inner circular groove into which, when said head is at said position of rest, said second tooth is pushed by said indicator button when said fuse cartridge has blown, and said first tooth is pushed by said spring means when said cartridge has been removed from said push member.

5. In a probe point device as claimed in claim 5, said cartridge being disposed axially within said push member and comprising a front and a rear heads, said push member having inner bosses to carry the pivot of said pawl at a distance from the longitudinal axis of said push member, said bosses forming abutments for the front head of said cartridge, and said probe point device further comprising a removable plug screwed into the rear end of said push member, said plug applying said terminal against the rear head of said cartridge.

6. In a probe device as claimed in claim 5, a metallic rod disposed axially with respect to said push member, said rod having a front and a rear ends with said front end carrying said point, a metallic core fixed to the rear end of said rod, means to fix said core to the front end of said push member, said core being formed with a slotted portion which extends into said push member in the form of a pair of opposed branches disposed each side of said pawl and said branches having resilient extensions between which said second head of said cartridge is pressed.

7. In a probe point device as claimed in claim 1, said cartridge being disposed axially within said push member and comprising a front and a rear heads, said rear head being formed with an axial depression and said terminal having an extension adapted to be disposed within said depression.

* * * * *